United States Patent [19]

Podowski et al.

[11] 4,021,756
[45] May 3, 1977

[54] ELECTRIC REMOTE CONTROL TRANSMITTER

[75] Inventors: Robert R. Podowski, Elmhurst; Richard W. Citta, Oak Park, both of Ill.

[73] Assignee: Zenith Radio Corporation, Glenview, Ill.

[22] Filed: July 2, 1975

[21] Appl. No.: 592,582

[52] U.S. Cl. ............ 331/117 R; 331/177 R; 331/179; 333/70 CR
[51] Int. Cl.² .......................................... H03B 5/20
[58] Field of Search ........ 331/110, 135, 136, 138, 331/117 R, 140, 141, 142, 168, 178, 179, 177; 333/70 CR

[56] References Cited

UNITED STATES PATENTS

| | | | |
|---|---|---|---|
| 2,173,427 | 9/1939 | Scott | 331/140 |
| 2,439,245 | 4/1948 | Dunn | 331/140 |
| 2,444,084 | 6/1948 | Artzt | 331/141 |
| 2,782,311 | 2/1957 | Colander et al. | 331/136 |
| 3,229,228 | 1/1966 | Reynolds | 331/141 |
| 3,303,435 | 2/1967 | Bradmiller et al. | 331/117 |
| 3,535,430 | 10/1970 | Maynard | 331/179 |
| 3,569,863 | 3/1971 | Cowpland | 331/110 |
| 3,686,587 | 8/1972 | Dann | 331/168 |

*Primary Examiner*—John Kominski
*Attorney, Agent, or Firm*—Nicholas A. Camasto

[57] ABSTRACT

An electronic remote control transmitter employs a two transistor cascade oscillator having positive and negative feedback loops. The oscillator voltage is supplied through a switch assembly containing a plurality of momentary contact switches to a pair of voltage dividers supplying signal voltages in predetermined ratios to a two branch circuit in the negative feedback loop. One branch contains an inductor and the second branch a capacitor. Closure of any switch completes the DC circuits for the transistors. Signal voltage is supplied to the branches to produce a minimum amplitude, zero phase shift condition which establishes oscillation at that predetermined frequency. The output of the oscillator is amplified by a third transistor and supplied to an ultrasonic transducer for generating acoustical control signals.

7 Claims, 1 Drawing Figure

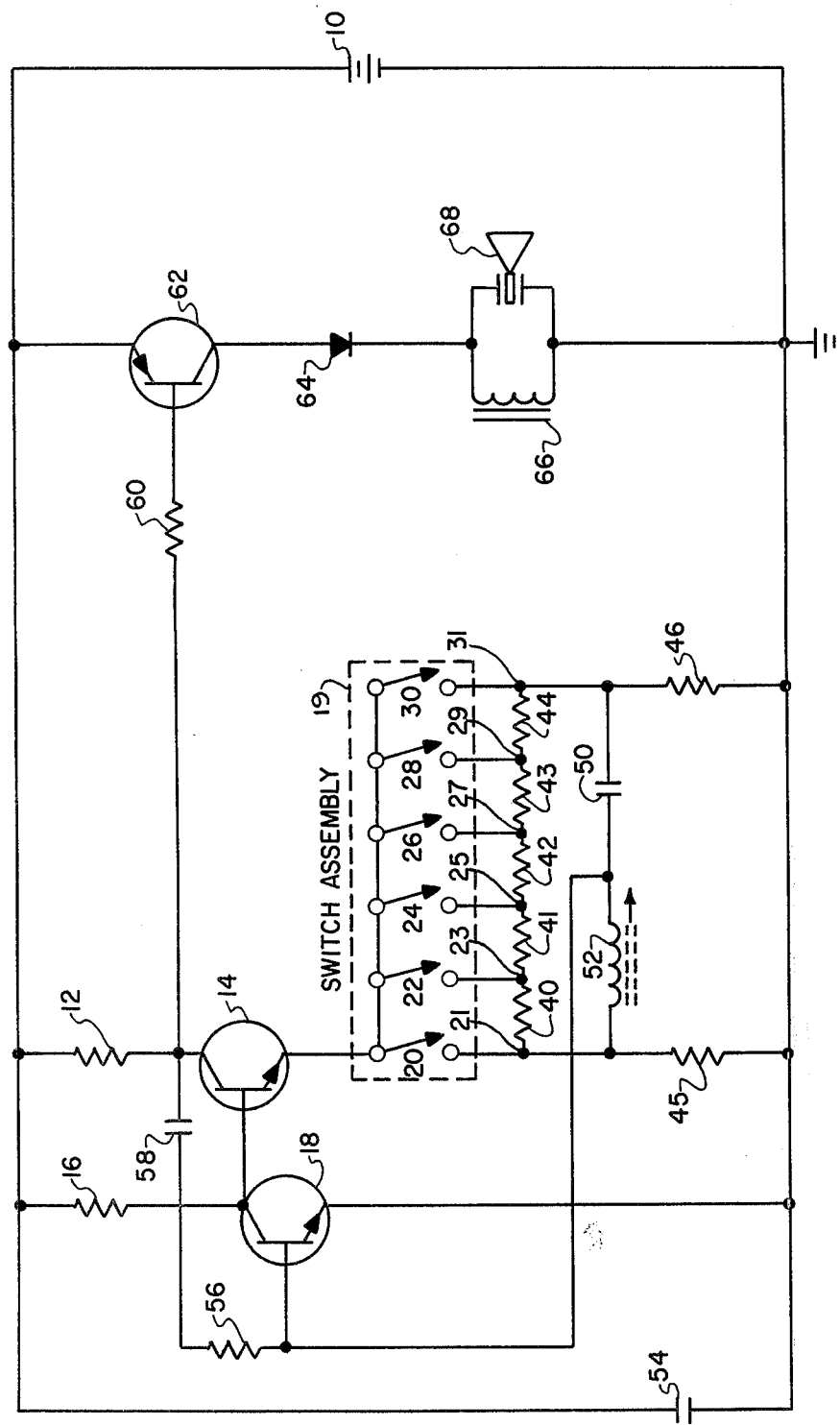

ELECTRIC REMOTE CONTROL TRANSMITTER

BACKGROUND OF THE INVENTION

The invention is concerned with a transmitter for wireless remote control systems. The receiver in such systems normally includes a transducer for converting acoustic control signals into corresponding electrical signals, decoding circuits for determining which function has been selected, and utilization circuits for performing the selected functions. Of principal interest is the transmitter producing the control signals.

It is well known that by appropriately striking rods of appropriate mass and length one can produce acoustical signals of sufficient frequency stability and duration for use as actuating or control signals in remote control systems. There have been many such devices on the market. This invention concerns an electronic transmitter which does not use the mechanical striking of a rod to produce the acoustic control signal.

There are several forms of electronic transmitters available. They generally include tank circuits in which various capacitor or inductor combinations are connected to produce the desired control frequencies. Usually a double pole switch connects the particular reactive element combination to produce the resonant frequency and applies power to turn on the oscillator in that sequence. Various forms of output circuits such as electrostatic microphones are utilized. An electrostatic microphone requires additional power since its operation is dependent upon a sizable voltage being applied and hence provides a drain on the battery. An important consideration is that the frequency be independent of battery voltage.

The invention concerns an electronic transmitter for a remote control system which incorporates simple, economical single contact switches and a purely resistive network for selecting control frequencies. The invention includes a cascade arrangement of transistors in the form of an oscillator having positive and negative feedback loops. The frequency selective elements in the negative feedback loop cause a minimum amplitude zero phase shift condition in the network and thus establish the frequency of oscillation for the oscillator. The oscillator arrangement produces a control signal having a frequency and amplitude which are independent of battery voltage variations.

Moreover the absolute values of the resistive components are not significant. Rather it is the ratio of these resistive components which establishes oscillator frequency. Thus the invention is uniquely suited for production by integrated circuit techniques such as a thick film circuit.

OBJECTS OF THE INVENTION

An object of this invention is to provide a novel transmitter for a remote control system.

Another object of this invention is to provide an improved electronic remote control transmitter.

SUMMARY OF THE INVENTION

In accordance with the invention a transmitter for selectively generating a plurality of control signals of differing frequencies for actuating a corresponding plurality of control functions in a remote receiver comprises an oscillator circuit having two frequency determining branches and capable of oscillation at several predetermined frequencies, corresponding to the control signal frequencies, dependent upon the ratio of signal voltages applied to the branches. Voltage dividing means, coupled to the oscillator circuit, have a plurality of resistive elements for changing the ratio of the signal voltages applied to the frequency determining branches.

BRIEF DESCRIPTION OF THE DRAWING

The single FIGURE shows the detailed circuitry of the preferred embodiment of the invention as a remote control transmitter for selectively generating control signals of predetermined frequency.

DESCRIPTION OF THE PREFERRED EMBODIMENT

The positive terminal of a battery 10 is connected to the emitter of a transistor 62, to a resistor 12, to a resistor 16 and to a capacitor 54. Resistor 12 is connected to the collector of a transistor 14, resistor 16 is connected to the collector of a transistor 18 and a capacitor 54 is connected to ground. The negative terminal of battery 10 is grounded. Capacitor 54 provides an additional AC bypass for battery 10. Transistors 14 and 18 are arranged in cascade with the collector of transistor 14 connected through a capacitor 58 and a resistor 56 to the base of transistor 18 and the collector of transistor 18 connected to the base of transistor 14. The emitter of transistor 18 is connected to ground and the emitter of transistor 14 is connected to a switch assembly 19.

Switch assembly 19 comprises six single pole, momentary contact switches 20, 22, 24, 26, 28 and 30 which when closed connect the signal voltage at the emitter of transistor 14 to corresponding taps 21, 23, 25, 27, 29 and 31 of a voltage divider, consisting of a series arrangement of seven resistors 40, 41, 42, 43, 44, 45 and 46. Tap 21 is at the junction of resistors 45 and 40, tap 23 connects to the junction of resistors 40 and 41, tap 25 to the junction of resistors 41 and 42, tap 27 to the junction between resistors 42 and 43, tap 29 to the junction of resistors 43 and 44 an tap 31 to the junction of resistors 44 and 46. Resistors 45 and 46 are connected to ground. When any one of switches 20 through 30 are closed the voltage at the emitter of transistor 14 is supplied between the corresponding divider tap and ground. Thus, there are two voltage dividing networks connected in parallel to proportion the signal voltage across the two divider networks. The closure of any one of the switches also connects DC power to both transistors to place them in their respective active regions. Tap 21 is connected to an inductor 52 and tap 31 is connected to a capacitor 50. The junction of inductor 52 and capacitor 50 is connected to the base of transistor 18.

The collector of transistor 14 is the output of the oscillator and is connected through a resistor 60 to the base of transistor 62. The collector of transistor 62 is connected through a diode 64 to a parallel arrangement of an inductor 66 and a microphone transducer 68. Diode 64 serves to decouple the oscillator from the output circuit. The other terminals of inductor 66 and transducer 68 are connected to ground.

In the cascade connection of transistors 14 and 18, transistor 18 is a common emitter stage and transistor 14 an emitter follower. It is well known that the outputs at the collector and emitter of transistor 14 are of opposite polarity. Transistor 14 provides the low output impedance for driving the negative feedback loop which comprises inductor 52, capacitor 50 and the resistive divider networks consisting of resistors 40–46. The frequency of oscillation is determined by the negative feedback network, the frequency being determined by the ratio of signal voltages applied to inductor 52 and capacitor 50. The amount of voltage applied to inductor 52 is dependent on resistor 45 and the portion of resistors 40–44 selected by the switch assembly 19. The voltage applied to capacitor 50 is determined by resistor 46 and the remaining portion of resistors 40–44.

The negative loop is completed by the connection of the junction of inductor 52 and capacitor 50 to the base of transistor 18. As described earlier this connection also completes a DC bias circuit for transistor 18. Resistor 12 which is the collector load of transistor 14, develops the oscillator output signal. Resistor 16 is the collector load for transistor 18 and develops the signal that is coupled to transistor 14.

Oscillation is maintained by a positive feedback loop consisting of capacitor 58 and resistor 56 connected from the output of transistor 14 to the input transistor 18.

The ratios of the signal voltages applied to the inductors and capacitors in the negative feedback loop are determined by the particular one of taps 21–31 selected by the operated one of switches 20–30. Assuming tap 25 is selected by switch 24, the amount of signal applied to inductor 52 is determined by the ratio of the sum of resistors 40 and 41 to the sum of resistors 40, 41 and 45. The amount of signal applied to capacitor 50 is determined by the ratio of the sum of resistors 42, 43 and 44 to the sum of resistors 42, 43, 44 and 46.

It can be shown that inductor 52 and capacitor 50 constitute a form of voltage controlled maximum transfer impedance network. A brief analysis of a somewhat similar circuit may be found in "Dual Input Null Networks", by U.S. Ganguly, Proc. IEEE (letters)-March,1966. When properly adjusted this network exhibits a maximum transfer impedance and zero phase shift between output and input at a particular frequency. The frequency at which the maximum transfer impedance occurs is determined by the ratio of the signal voltages applied to inductor 52 and to capacitor 50 as well as the values of inductor 52 and capacitor 50. As seen above, the ratio of the voltages applied to inductor and capacitor are determined by the resistive dividers.

Oscillation is initiated and maintained by the positive feedback loop and the frequency of oscillation is determined by the negative feedback loop. Amplitude and frequency stability is maintained in the oscillator through a DC path which is completed through the negative feedback loop. This establishes the DC operating levels at the voltage equivalent of two "diode drops" thus rendering frequency stability independent of battery voltage variations. This condition would continue until the battery is unable to provide the equivalent two diode drop voltage.

The negative loop DC path includes the emitter of transistor 14, the closed one of the switches in switch assembly 19, inductor 52 and the base of transistor 18. The DC magnitude of the collector of transistor 18 does not appreciably depart from the two "diode drops" above ground potential. This may be verified as follows. The term "diode drops" is used to include silicon as well as germanium transistors. For silicon transistors the base-emitter voltage drop is approximately 0.7 volts, whereas for germanium transistors it is approximately 0.3 volts. Silicon transistors are used in the transmitter of the invention. With transistor 14 its base to emitter voltage drop is approximately 0.7 volts. The drop through the switch is zero; the DC drop through the inductor is approximately zero and the voltage drop between the base and emitter of transistor 18 is also 0.7 volts. Therefore, the potential of the collector of transistor 18 can never depart appreciably from 1.4 volts above ground.

Assuming a different switch closure (for example, switch 24) the DC path branches through resistors 41 and 40 in addition to the above mentioned path. The small current that flows through these two resistors results in a small additional voltage drop. Thus DC at the collector of transistor 18 is slightly higher than 1.4 volts. Additional voltage drop through the divider networks are small compared with the 1.4 volts and therefore the collector voltage is essentially constant under all switch closure conditions.

As is well known, any oscillator requires a non-linear element to limit the amplitude of the oscillator signal. In this embodiment the non-linearity is provided by transistor 14. Since the DC collector voltage of transistor 18 is at 1.4 volts above ground, the DC voltage at the emitter of transistor 14 is 0.7 volts above ground. This is the reference about which the AC signals swings. Therefore, a signal at the base of transistor 14 below 0.7 volts will be limited in the negative direction by turn off of transistor 14. Because the oscillator signal is symmetrical, its positive portion is also limited to 0.7 volts above the DC reference. Therefore, the amplitude of the oscillator signal is held at two "diode drops" (1.4volts) peak to peak. Positive feedback insures that the amplitude does not go below this magnitude. These features combine to make the signal amplitude substantially independent of supply voltage variation. Since the AC signal amplitudes are nearly constant, the drive to the base of transistor 14 is nearly constant and therefore the AC signal appearing at the collector of transistor 14 is also constant. This constant drive is supplied through resistor 60 to the output amplifier consisting of transistor 62, diode 64, inductor 66 and output transducer 68. Transducer 68 connects the electrical oscillator signal to an acoustical signal of the same frequency.

What has been shown is a novel remote control system transmitter utilizing single contact switches to activate a pure resistively tuned oscillator having positive and negative feedback loops. The closure of a single contact switch applies voltages in predetermined ratios to the branches of a circuit in the negative feedback loop causing a minimum impedance condition. The oscillator frequency and amplitude output is very precise and independent of battery voltage variations.

While particular embodiments of the invention have been shown and described, it will be obvious to those skilled in the art that changes and modifications may be made thereto without departing from the invention in its broader aspects and, therefore, the aim in the appended claims is to cover all such changes and modifications as fall within the true spirit and scope of the invention.

What is claimed is:

1. A transmitter for selectively generating a plurality of control signals of differing frequency for actuating a corresponding plurality of control functions in a remote receiver, comprising:

an oscillator circuit including an amplifier with a positive feedback loop, and a negative feedback loop having an AC and a DC frequency determining branch and being capable of oscillation at several predetermined frequencies corresponding to said control signal frequencies dependent upon the ratio of signal voltages applied to said branches; and voltage dividing means coupled to said oscillator circuit and having a plurality of resistive elements for changing the ratio of said signal voltages applied to said branches.

2. The transmitter of claim 1 further including means for maintaining a stable frequency in said oscillator by establishing the DC operating voltage levels independently of battery voltage variations.

3. The transmitter of claim 2 wherein said voltage dividing means comprises a plurality of serially connected resistors with taps at their junctions;

and a plurality of single contact switches coupled between said taps and said oscillator circuit, closure of any of said switches forming two parallel voltage dividing networks across said oscillator circuit.

4. The transmitter of claim 3 wherein said first frequency determining branch comprises a high pass filter capacitor connected to a first tap of a first one of said voltage dividing networks, and said second frequency determining branch comprises a low pass filter inductor connected to a second tap of said second voltage dividing networks.

5. The transmitter of claim 4 wherein said oscillator circuit comprises a first and a second transistor in a cascade arrangement having a capacitor connected between the collector of said second transistor and the base of said first transistor providing said positive feedback loop for said oscillator.

6. The transmitter of claim 5 wherein the emitter of said second transistor is connected to said plurality of single contact switches; said inductor and said capacitor being connected together and to the base of said first transistor completing said negative feedback loop of said oscillator.

7. The transmitter of claim 6 wherein said means maintaining a stable frequency include a DC connection through said negative feedback loop and said cascade connection of transistor.

* * * * *